(12) United States Patent
Ishii et al.

(10) Patent No.: US 6,359,510 B1
(45) Date of Patent: Mar. 19, 2002

(54) AMPLIFIER CIRCUIT

(75) Inventors: Hirotomo Ishii, Kamakura; Zdzislaw Czarnul, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/658,194

(22) Filed: Sep. 8, 2000

(30) Foreign Application Priority Data

Sep. 10, 1999 (JP) .......................................... 11-258056

(51) Int. Cl.[7] ................................................ H03F 3/45
(52) U.S. Cl. ...................................... 330/253; 330/260
(58) Field of Search ................................ 330/252, 253, 330/260

(56) References Cited

U.S. PATENT DOCUMENTS 5,861,778 A  *  1/1999  Louagie et al. ............. 330/260
5,990,737 A      11/1999  Czarnul et al.

FOREIGN PATENT DOCUMENTS

JP     10-150333    6/1998
JP     11-008546    1/1999

OTHER PUBLICATIONS

Säckinger et al., "A Versatile Building Block: The CMOS Differential Difference Amplifier," IEEE Journal of Solid–State Circuits (Apr. 1987), SC–22 :287–294.

Czarnul et al., "Design of Fully Balanced Analog Systems Based on Ordinary and/or Modified Single–Ended Opamps," IEICE Trans. Fundamentals (Feb. 1999), E82:256–270.

* cited by examiner

Primary Examiner—Michael B Shingleton
(74) Attorney, Agent, or Firm—Finnegan, Henderson, Farabow, Garrett & Dunner, L.L.P.

(57) ABSTRACT

A balanced type DDA 1 is combined with a single end type DDA 2 to form a differential amplifier circuit 3 which is a balanced type DDA. The balanced type DDA 1 has four input terminals VPP, VPN, VNN and VNP which are input terminals of two differential input stages, and two output terminals VoutP and VoutN which are output terminals of two output stages. These terminals are four input terminals and two output terminals of the differential amplifier circuit 3. The single end type DDA 2 has four input terminals, which are input terminals of two differential input stages and which are connected to the four input terminals of the differential amplifier circuit 3, respectively. The single end type DDA 2 also has an output terminal Vout of one output stage, which serves as a control output terminal for the feedback control of the differential amplifier circuit 3. By the negative feedback of the signal of the control output terminal Vout, a virtual short-circuit can be established between two input terminals of each differential input stages, so that it is possible to reduce distortion without reducing gains.

12 Claims, 6 Drawing Sheets

AMPLIFIER CIRCUIT

BACKGROUND OF THE INVENTION

1. Field of the Invention

The present invention relates generally to a fully differential type amplifier circuit using a differential difference amplifier (DDA).

2. Description of the Related Background Art

Figure 1:
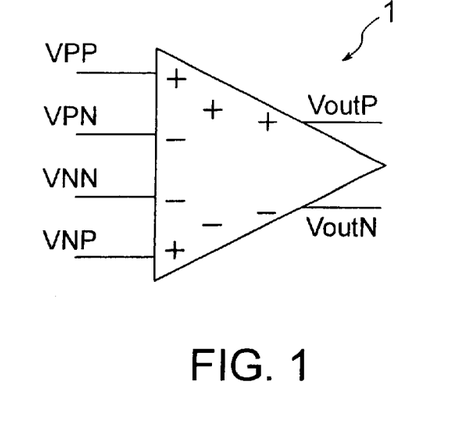
FIG. 1 is a symbolic diagram of a balanced type DDA.

Conventionally, in order to form a non-inverting amplifier having large input impedance, a technique based on a fully differential type (balanced type) DDA is employed. The balanced type DDA is shown in a symbolic diagram of FIG. 1 and in a circuit diagram of FIG. 2. This DDA 1 includes: a differential input stage 11 comprising NMOS transistors Q1, Q2 and Q13; a differential input stage 12 comprising NMOS transistors Q3, Q4 and Q15; an output stage 13 having a PMOS transistor Q11 and an NMOS transistor Q14; an output stage 14 having a PMOS transistor Q12 and an NMOS transistor Q16; four input terminals VPP, VPN, VNP and VNN; and two output terminals VoutP and VoutN.

Figure 2:
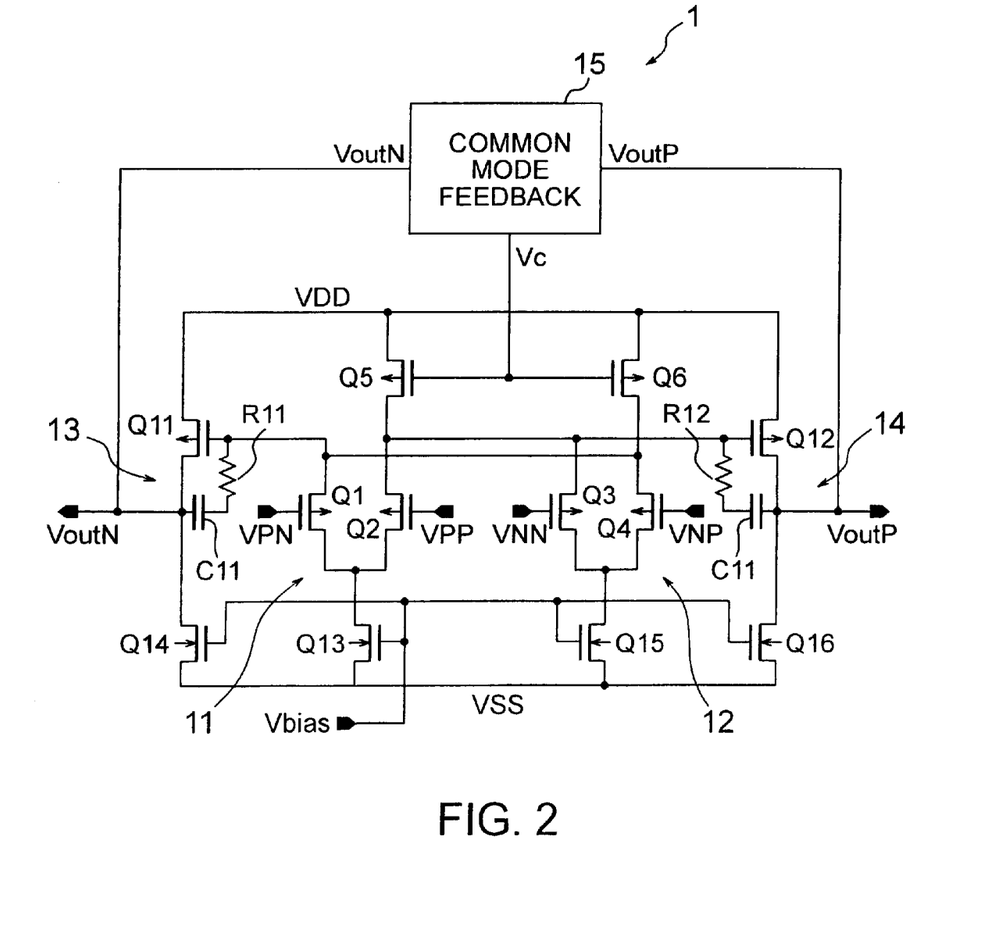
FIG. 2 is a circuit diagram of an example of the balanced type DDA.

Between the output terminals VoutN and VoutP, a common mode feedback circuit 15 is provided. The common mode feedback circuit 15 controls the gate voltages of PMOS transistors Q5 and Q6 which are used as common loads to the two differential input stages 11 and 12. The connection node of the transistors Q5, Q2 and Q3 controls the gate of one output stage transistor Q12, and the connection node of the transistors Q6, Q4 and Q1 controls the gate of the other output stage transistor Q11.

A resistor R11 and a capacitor C11, which are provided between the gate and drain of the output stage transistor Q11, constitute a phase compensator circuit. Similarly, a resistor R12 and a capacitor C12, which are provided between the gate and drain of the output stage transistor Q12, constitute a phase compensator circuit. The NMOS transistors Q13 through Q16 are current source transistors for controlling a bias current for each of the differential input stages 11 and 12, and are controlled by a voltage Vbias which is applied from the outside of the circuit.

Figure 3:
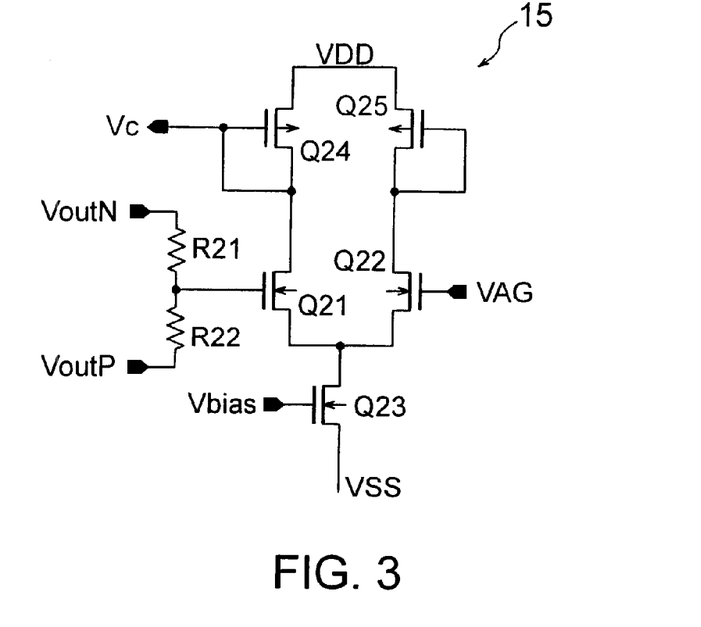
FIG. 3 is a circuit diagram of an example of an common mode feedback circuit in the balanced type DDA.

The common mode feedback circuit 15 is designed to carry out a negative feedback control for suppressing a output common mode component. For example, the common mode feedback circuit 15 is formed as shown in FIG. 3. The common mode feedback circuit 15 of FIG. 3 includes: a differential input stage comprising NMOS transistors Q21, Q22 and Q23; and a load circuit comprising PMOS transistors Q24 and Q25 which are diode-connected. The gate of one transistor Q21 of the differential input stage is connected to output terminals VoutN and VoutP via resistors R21 and R22, respectively. By these resistors R21 and R22, a common mode component contained in output signals VoutN and VoutP of the balanced type DDA 1 is detected. This is compared with a reference voltage VAG applied to the gate of the other transistor Q22 and a control signal VC is generated. By this control signal VC, the negative feedback control of the DDA 1 is carried out, so that the output common mode voltage is substantially equal to the VAG.

Figure 4:
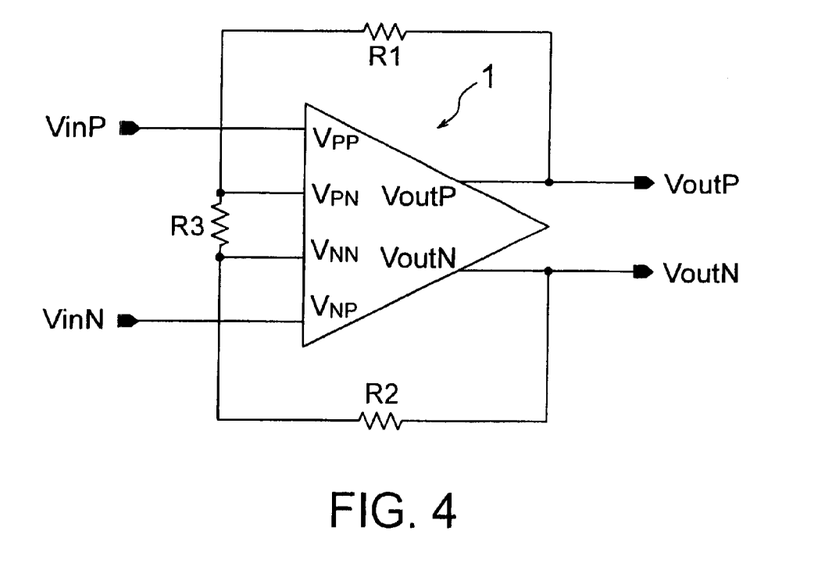
FIG. 4 is a circuit diagram of a conventional non-inverting amplifier circuit using the balanced type DDA.

In such a balanced type DDA 1 having four inputs and two outputs, the output signal of one output terminal VoutP has a positive gain with respect to an input signal of a difference between the input terminal VPP and the input terminal VPN, and the output signal of the other output terminal VoutN has a negative gain with respect thereto. In addition, one output terminal VoutP has a negative gain with respect to an input signal of a difference between the input terminal VNP and the input terminal VNN, and the other output terminal VoutN has a positive gain with respect thereto. These gains are determined by a product of the gain of the differential input stage by the gain of the output stage. Assuming that the mutual conductance of the MOS transistors Q1, Q2, Q3 and Q4 is gm, the drain-to-source conductance is gdsn, and the drain-to-source conductance of the MOS transistors Q5 and Q6 is gdsp, then, the gain of the differential input stage with respect to the differential input signal is gm/(gdsn+gdsp). Therefore, it can be seen that the mutual conductance of the differential transistor pair of the differential input stage is in proportion to the absolute value of the gain of the DDA 1. Using such a balanced type DDA 1, a non-inverting amplifier circuit is formed as shown in FIG. 4. This circuit comprises resistors R1 through R3 in addition to the balanced type DDA 1, and outputs VoutP and VoutN with respect to VinP and VinN. Since a negative feedback is applied to the circuit by the resistors R1 through R3, the operation of this non-linear amplifier circuit satisfies the following formula (1) assuming that the gain of the balanced type DDA 1 is infinity.

$$(VPP-VPN)-(VNP-VNN)=0 \qquad (1)$$

Therefore, assuming that the resistance value of the resistor R3 is Ra and that the resistance value of the resistors R1 and R2 is Rb, the gain A of this circuit is expressed by the following formula (2).

$$A=\{Rb+(Ra/2)\}/(Ra/2) \qquad (2)$$

Assuming that the common mode component of the input voltages VinP and VinN is VCMi, the differential component thereof is Vi, the common mode component of the output voltages VoutP and VoutN is VCMO, and the differential output component thereof is Vo, then, the following relationships (3) through (7) are established.

$$VPP=VCMi+Vi \qquad (3)$$

$$VNP=VCMi-Vi \qquad (4)$$

$$VoutP=VCMO+Vo \qquad (5)$$

$$VoutN=VCMO-Vo \qquad (6)$$

$$Vo=A \cdot Vi \qquad (7)$$

Since the input terminal of the balanced type DDA 1 is connected to the gate of the MOS transistor as shown in FIG. 2, no current flows into the input terminal in principle. Therefore, VPN and VNN are determined by the resistors R1 through R3 and the output voltages VoutP and VoutN as shown in the following formulae (8) and (9).

$$VPN=VAG+Vi \qquad (8)$$

$$VNN=VAG-Vi \qquad (9)$$

If VCMi≠VCMO, then VPP≠VPN and VNP≠VNN. That is, if the common mode component VCM of the input voltage of the DDA 1 is different from the common mode component VCMO of the output voltage, two signals inputted to the differential input stage have different voltages.

Figure 5:
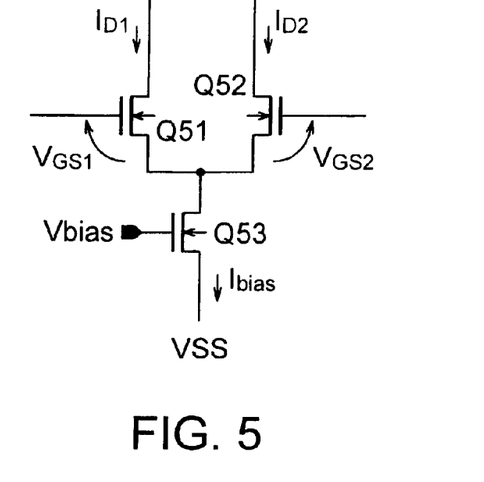
FIG. 5 is a circuit diagram of a simple differential input stage constituting a DDA.
Figure 6:
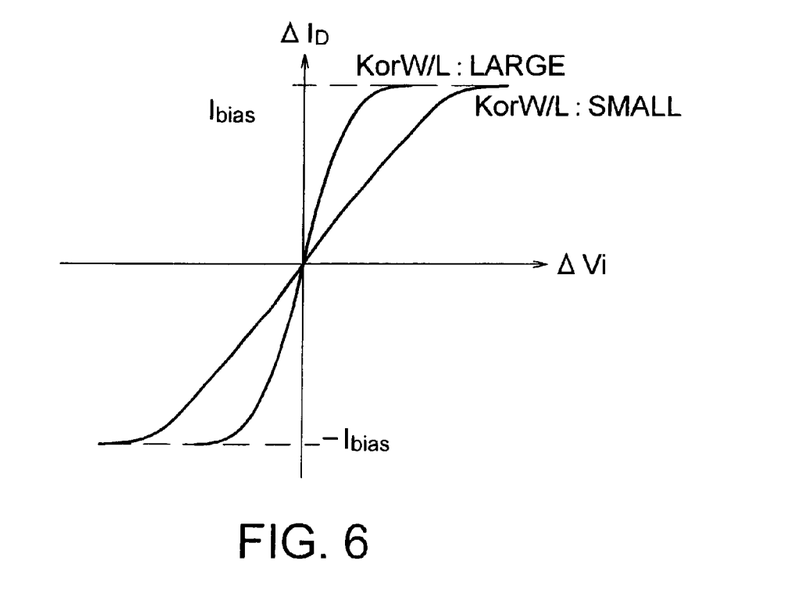
FIG. 6 is a graph showing characteristics of the differential input stage.

Referring to FIGS. 5 and 6, the operation of the differential input stage will be considered. The differential input stage of FIG. 5 comprises NMOS transistors Q51, Q52 and Q53. The gate potential of the NMOS transistor Q53 is controlled by a voltage Vbias so as to flow a desired bias current Ibias. It is herein assumed that the gate-to-source voltage of the MOS transistor Q51 is VGS1, the drain current thereof is ID1, the gate-to-source voltage of the MOS transistor Q52 is VGS2, and the drain current thereof is ID2. Assuming that the characteristics of the MOS transistors Q51 and Q52 can be expressed by ID=K (VGS−VTH)$^2$ using a gate-to-source voltage VGS, a drain current ID, a threshold voltage VTH and a mutual conductance parameter K, then, the relationship between ΔVi=VGS1−VGS2 and ΔID=ID1−ID2 is expressed by the following formula (10).

$$\Delta ID = \Delta Vi \cdot K \{2Ibias/K - (\Delta Vi)^2\}^{1/2} \quad (10)$$

The relationship of the formula (10) is shown in FIG. 6. It can be seen from this figure that a range (a linear operation range of a differential input stage), in which ΔID varies substantially linearly with respect to ΔVi, is inversely in proportion to K. If this range is not sufficiently large as compared with the difference between the voltages of two signals inputted to the differential input stage, distortion occurs.

Therefore, it is conventionally designed that the linear operation range of the differential input stage is sufficiently large. Assuming that the channel width of the MOS transistor is W and the channel length thereof is L, K is in proportion to W/L, so that the linear operation range of the differential input stage can be enlarged if the W/L is decreased.

However, in this method, as can be seen from FIG. 6, the mutual conductance (ΔID/ΔVi) of the differential input stage decreases, so that there is a problem in that the gain of the DDA decreases. As a result, there are other problems in that it is not possible to obtain a desired high gain, or if it is required to provide a DDA having a large gain-bandwidth product (GB product), it is required to take measures to increase the number of gain stages, and if the number of gain stages is increased, it is difficult to carry out a phase compensation.

Figure 7:
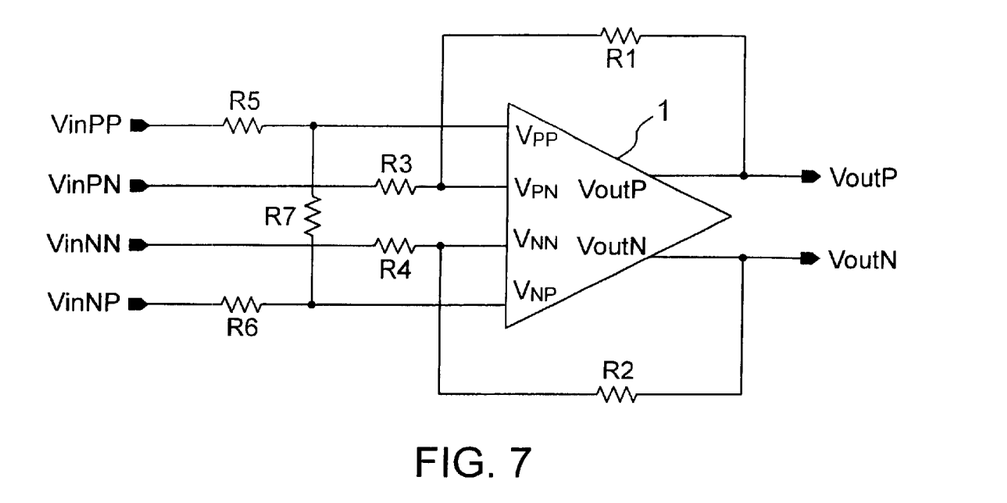
FIG. 7 is a circuit diagram of a multiple input circuit using a conventional balanced type DDA.

In addition, a multiple input circuit using the balanced type DDA 1 is shown in FIG. 7. This multiple input circuit comprises the balanced type DDA 1 and resistors R1 through R7. This circuit is designed to input VinPP, VinNN, VinPn and VinNP and output VoutP and VoutN. In this circuit, in accordance with a differential component ViN between the input voltages VinPN and VinNN and a differential component ViP between the input voltages VinPP and VinNP, a differential output VoutP−VoutN determined by VsP−ViN is obtained.

In this case, since a negative feedback is applied to the circuit by the resistors R1 through R4, the operation of the circuit satisfies the above described formula (1) assuming that the gain of the balanced type DDA 1 is infinity.

Therefore, if it is set that R3=R4=Ra, R1=R2=Rb, R5=R6=Rc and R7=Rd, assuming that the differential component between the input voltages VinPN and VinNN is ViN and that the differential component between the input voltages VinPP and VinNP is ViP, the differential output component Vo of the output voltages VoutP and VoutN of this circuit is expressed by the following formula (11).

$$Vo = \frac{(Rd/2)(Ra+Rb)}{(Rc+Rd/2)Ra} ViP - \frac{Rb}{Ra} ViN \quad (11)$$

Assuming that the common mode component of the input voltages VinPN and VinNN is VCMN, the common mode component of the input voltages VinPP and VinNP is VCMP, the differential component of the output voltages VoutP and VoutN is Vo, and the common mode component thereof is VCMO, then, VPP and VPN are expressed by the following formulae (12) and (13), respectively.

$$VPP = \frac{Rd/2}{Rc+Rd/2} ViP + VCMP \quad (12)$$

$$VPN = \frac{(Rd/2)ViP}{Rc+Rd/2} + \frac{Rb \cdot VCMN}{Ra+Rb} + \frac{Ra \cdot VCMO}{Ra+Rb} \quad (13)$$

It can be seen from these formulae that VPP≠VPN in general. The other pair of input voltages VNP and VNN are the same. That is, in the multiple input circuit shown in FIG. 7 similar to FIG. 4, two input signals to the differential input stage have different voltages to cause distortion. In order to solve this problem, it is required to enlarge the linear operation range of the balanced type DDA 1, so that the same problem as that in FIG. 4 is caused.

As described above, there are problems in that if the conventional balanced type DDA comprises a linear amplifier circuit and a multiple input circuit, distortion occurs, that if the linear operation range is intended to be enlarged in order to reduce distortion, the gain reduces, and that if the number of gain stages is increased to compensate this, it is difficult to carry out a phase compensation.

SUMMARY OF THE INVENTION

It is therefore an object of the present invention to eliminate the aforementioned problems and to provide an amplifier circuit capable of reducing distortion without reducing gains.

It is another object of the present invention to provide a non-inverting amplifier circuit and a multiple input circuit, which use such an amplifier circuit.

According a first aspect of the present invention there is provided an amplifier circuit comprising:
  a first four-input balanced amplifier having
  a first differential terminal pair and a second differential terminal pair;
  a first output terminal and a second output terminal, output signals at the first output terminal and the second output terminal being complementary; and
  a second four input single-ended amplifier having
  a third differential terminal pair and a fourth differential terminal pair;
  a third output terminal;
  wherein the first differential terminal pair and the third differential terminal pair are connected in parallel, and the second differential terminal pair and the fourth differential terminal pair are connected in reverse parallel.

According a second aspect of the present invention there is provided an amplifier circuit comprising:
  a first four-input balanced amplifier having
  a first differential terminal pair and a second differential terminal pair;
  a first output terminal and a second output terminal, output signals at the first output terminal and the second output terminal being complementary; and
  a second four input single-ended amplifier having
  a third differential terminal pair and a fourth differential terminal pair;
  a third output terminal;
  wherein the first differential terminal pair and the third differential terminal pair are connected in reverse parallel, and the second differential terminal pair and the fourth differential terminal pair are connected in parallel.

According to the present invention, a balanced type DDA, to which input terminals are commonly connected, is combined with a single end type DDA, so that the output terminal of the single end type DDA serves as a control output terminal. By carrying out a negative feedback control on the basis of the output of the control output terminal, a virtual short-circuit can be established between first and second input terminals and between third and fourth input terminals. Therefore, it is possible to reduce distortion without reducing gains.

BRIEF DESCRIPTION OF THE DRAWINGS

The present invention will be understood more fully from the following detailed description and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

First Preferred Embodiment

Figure 8:
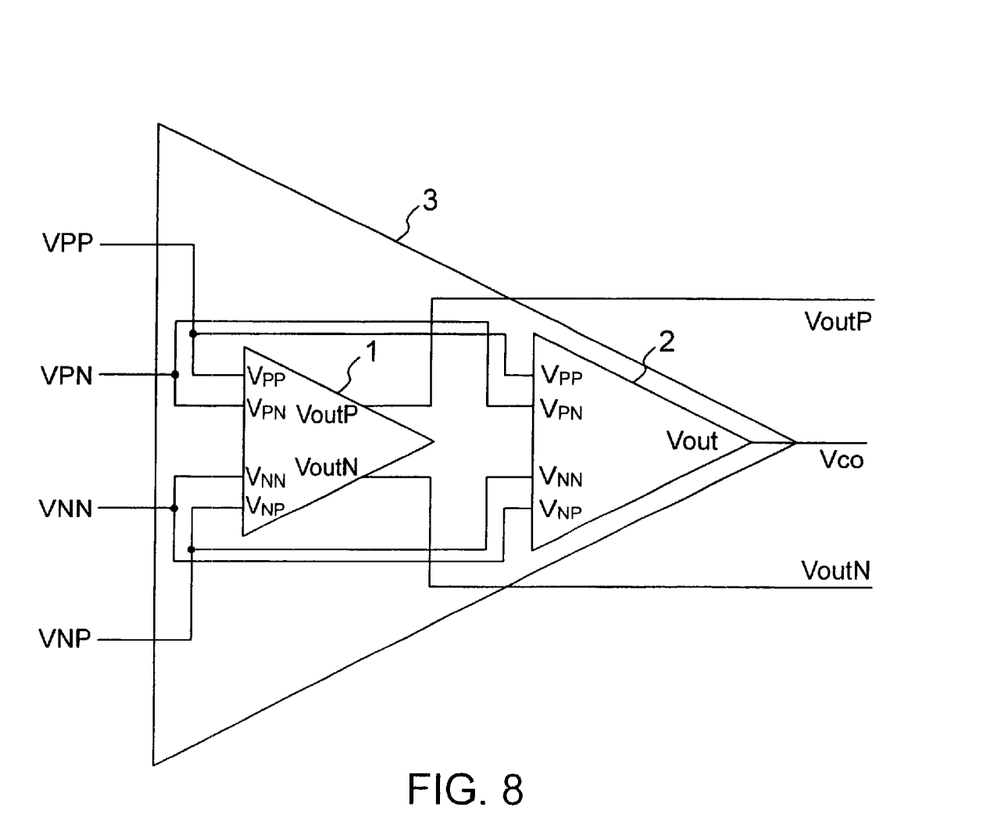
FIG. 8 is a circuit diagram of the first preferred embodiment of a differential amplifier circuit according to the present invention.

FIG. 8 shows the first preferred embodiment of a differential amplifier circuit 3 according to the present invention. This differential amplifier circuit 3 comprises a balanced type DDA 1 and a single ended type DDA 2. The balanced type DDA 1 is the same as those shown in FIGS. 1 and 2, and has two differential input stages and an common mode feedback circuit. Four input terminals VPP, VPN, VNN and VNP of the DDA 1 are four input terminals of the differential amplifier circuit 3, and two output terminals VoutP and VoutN of the DDA 1 are two output terminals of the differential amplifier circuit 3.

In the balanced type DDA 1, an output signal from the output terminal VoutP has a first positive gain with respect to an input signal of a difference between the input terminal VPP and the input terminal VPN, and an output signal from the output VoutN has a second negative gain, the absolute value of which is substantially equal to that of the first gain. In addition, with respect to an input signal of a difference between the input terminal VNP and the input terminal VNN, an output signal from the output terminal VoutP has a third negative gain, the absolute value of which is substantially equal to that of the first gain, and an output signal from the output terminal VoutN has a fourth positive gain, the absolute value of which is substantially equal to that of the third gain.

Figure 9:
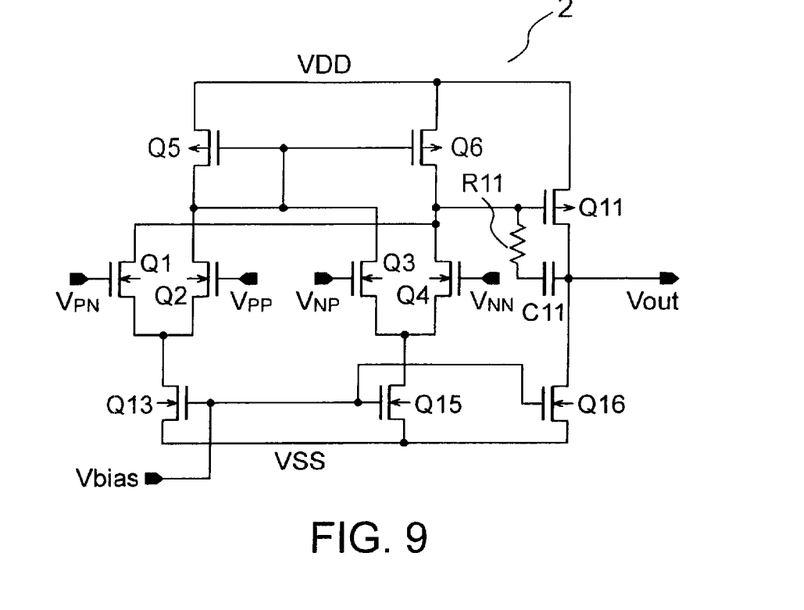
FIG. 9 is a circuit diagram of a single end type DDA of FIG. 8.

The single ended type DDA 2 has four input terminals corresponding to the four input terminals VPP, VPN, VNN and VNP of the balanced type DDA 1, and an output terminal Vco. Two input terminals VPP and VPN of the four input terminals of the single end type DDA 2 are connected to corresponding two input terminals VPP and VPN of the four input terminals of the balanced type DDA 1, respectively, whereas the remaining two input terminals VNN and VNP of the single end type DDA 2 are inversely connected to the remaining two input terminals VNP and VNN of the balanced type DDA 1, respectively. The output terminal Vco of the single end type DDA 2 serves as a control output terminal of the differential amplifier circuit 3. For example, the single ended type DDA 2 is formed as shown in FIG. 9. In this figure, one output stage 14 of the two output stages 13 and 14 of the balanced type DDA shown in FIG. 2, and the accompanying phase compensator circuit thereof are removed, and the common mode feedback circuit 15 is also removed. In addition, in PHOS transistors Q5 and Q6 which are loads of two differential input stages, the gate and drain of the transistor Q5 are connected to each other to form a PMOS current mirror load. Its one output terminal VoutN is a control output terminal Vco of the DDA 2.

In the single ended type DDA 2, the output signal of the output terminal Vco has a positive gain with respect to the input signal between the input terminals VPP and VPN, and the output signal of the output terminal Vco substantially has the same positive gain with respect to the input signal between the input terminals VNN and VNP.

Figure 10:
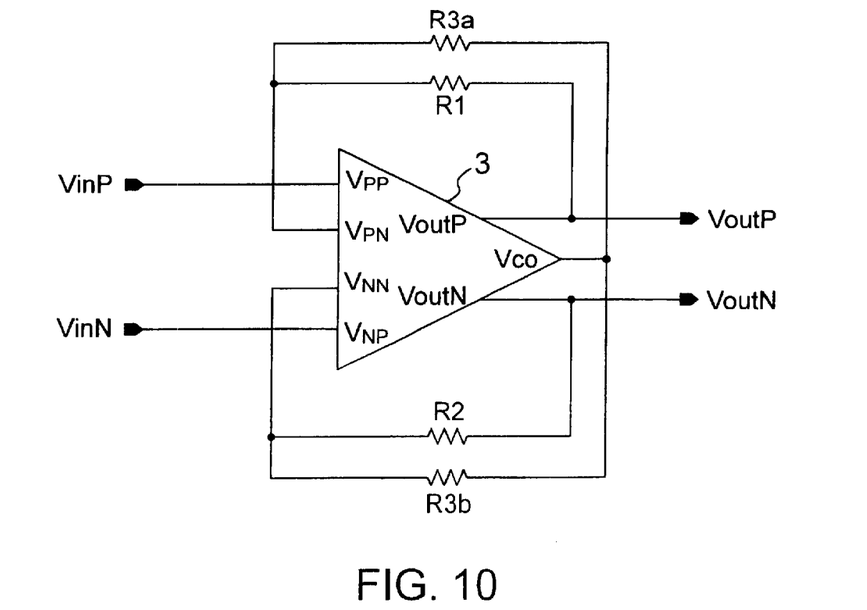
FIG. 10 is a circuit diagram of a non-inverting amplifier circuit using the differential amplifier circuit of FIG. 8.

FIG. 10 is a circuit diagram of a non-inverting amplifier circuit in this preferred embodiment, which uses the differential amplifier circuit 3 shown in FIG. 8. As shown in this figure, the input terminals VPP and VNP of the input terminals VPP, VPN, VNN and VNP of the differential amplifier circuit 3 serve as differential signal input terminals. The signal of one output terminal VoutP is negatively fed back to the input terminal VPN via a resistor R1, and the signal of the other output terminal VoutN is negatively fed back to the input terminal VNN via a resister R2. The signal of the control output terminal Vco is negatively fed back to the input terminal VPN via a resistor R3a, and to the input terminal VNN via a resistor R3b.

By the negative feedback via the resistors R1 and R2, the non-inverting amplifier circuit in this preferred embodiment operates so as to satisfy the relationship expressed by the formula (1), similar to the conventional circuit, if the gain of the balanced type DDA 1 is infinity. On the other hand, since the negative feedback is carried out from the control output terminal Vco to the input terminals VPN and VNN via the resistors R3a and R3b, respectively, the following formula (14) is satisfied if the gain of the single end DDA 2 is infinity.

$$(VPP-VPN)+(VIP-VIN)=0 \quad (14)$$

Because of simultaneously the formulae (1) and (14) is satisfied, the following conditions (15) and (16) are resulted.

$$VPP=VPN \quad (15)$$

$$VNP=VNN \quad (16)$$

Therefore, in the non-inverting amplifier circuit shown in FIG. 10, a virtual short-circuit is established between two input terminals of each differential input stages of the balanced type DDA 1 in the differential amplifier circuit 3, so the distortions are greatly suppressed. Assuming that the value of resistance of the resistors R3a and R3b is Ra and that the value of resistance of the resistors R1 and R2 is Rb, the gain of the non-inverting amplifier circuit is given by the following formula (17).

$$A=\{Rb+(Ra/2)\}/(Ra/2) \quad (17)$$

As described above, according to this preferred embodiment, even if the common mode component of the input signal of the balanced type DDA 1 is different from the common mode component of the output signal, it is possible to reduce distortion by incorporating the single ended type DDA 2 to carry out a negative feedback. In addition, unlike conventional circuits, it is not required to reduce the gain of the balanced type DDA in order to reduce distortion, so that it is possible to easily carry out a phase compensation, and to implement the desired transfer function with much greater accuracy with comparison to conventional one.

Second Preferred Embodiment

Figure 11:
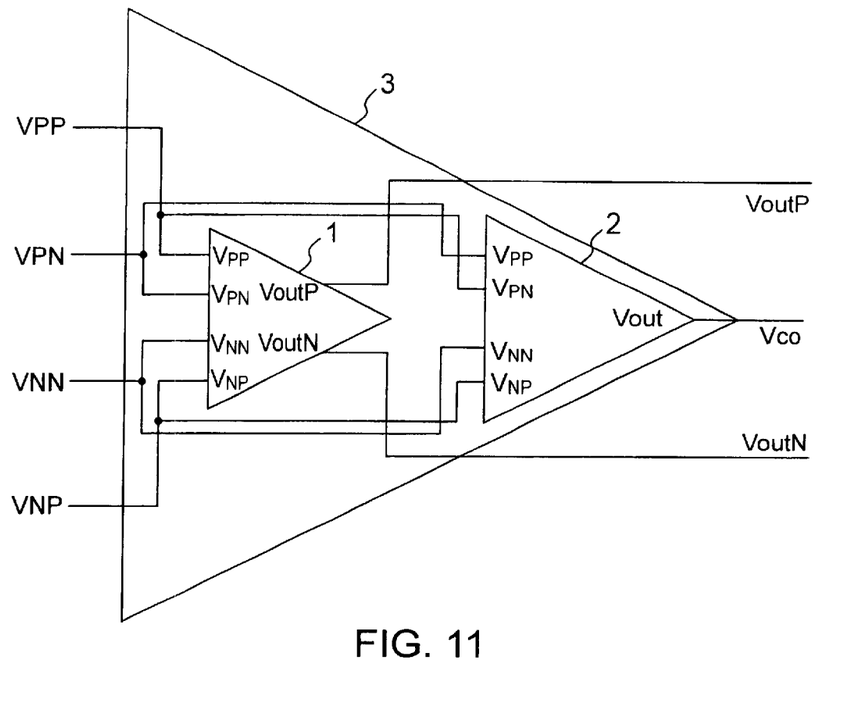
FIG. 11 is a circuit diagram of the second preferred embodiment of a differential amplifier circuit according to the present invention.

FIG. 11 shows the second preferred embodiment of a differential amplifier circuit 3a according to the present invention. Also in this preferred embodiment similar to the first preferred embodiment, a balanced type DDA 1 and a single ended type DDA 2 are used. However, the relationship between the connections of input terminals is opposite to that in FIG. 8. That is, two input terminals VNN and VNP of the four input terminals of the single ended type DDA 2 are connected to corresponding two input terminals VNN and VNP of the four input terminals of the balanced type DDA 1, respectively, whereas the remaining two input terminals VPP and VPN of the single end type DDA 2 are inversely connected to the remaining two input terminals VPN and VPP of the balanced type DDA 1, respectively.

Figure 12:
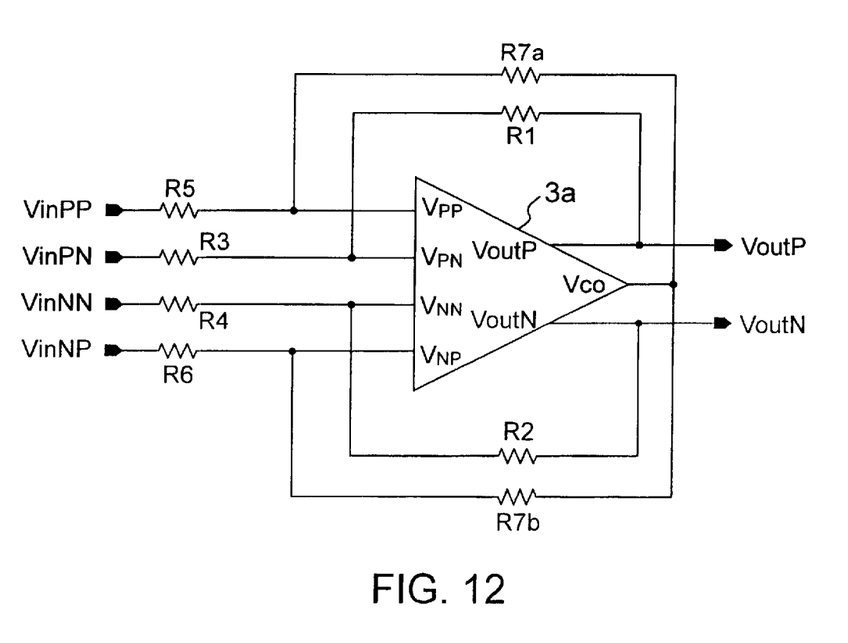
FIG. 12 is a circuit diagram of a multiple input circuit using the differential amplifier circuit of FIG. 11.

FIG. 12 shows a multiple input circuit using the differential amplifier circuit 3a of FIG. 11. To the four input terminals VPP, VPN, VNN and VNP of the differential amplifier circuit 3a, input signals VinPP, VinPN, VinNN and VinNP are supplied via input resistors R5, R3, R4 and R6, respectively. Output terminals VoutP and VoutN are negatively fed to the input terminals VPN and VNN via resistors R1 and R2, respectively.

Also in this preferred embodiment, if the gain of the balanced type DDA 1 is infinity, the relationship expressed by the formula (1) is established similar to the preceding preferred embodiment. In addition, if the gain of the single ended type DDA 2 is infinity, the relationship expressed by the formula (14) is established similar to the preceding preferred embodiment. Therefore, similar to the preceding preferred embodiment, the relationship expressed by the formula (15) and (16) is established, and a virtual short-circuit is established between all of the input terminals of two differential input stages of the balanced type DDA 1, so the distortions are greatly suppressed. Assuming that the value of resistance of the resistors R3 and R4 is Ra, the value of resistance of the resistors R1 and R2 is Rb, the value of resistance of the resistors R5 and R6 is Rc, and the value of resistance of the resistors R7a and R7b is Rd/2, then, the output differential component Vo of this circuit is given by the formula (11) similar to the conventional circuit shown in FIG. 7.

$$Vo = \frac{(Rd/2)(Ra+Rb)}{(Rc+Rd/2)Ra} ViP - \frac{Rb}{Ra} ViN \quad (11)$$

While the resistors have been inserted into the feedback paths of the differential amplifier circuit 3 in the above described preferred embodiments, other feedback circuit elements or impedance elements, e.g., capacities, not resistors, may be inserted.

The amplifier circuit according to the present invention can form various feedback circuits in accordance with uses. For example, the amplifier circuit may comprise a feedback circuit for causing the output signal of a first output terminal to be negatively fed back to first and third differential input stages, a feedback circuit for causing the output signal of a second output terminal to be negatively fed back to second and fourth differential input stages, and a feedback circuit for causing the output signal of a third output terminal to be negatively fed back to the first through fourth differential input stages.

As described above, according to the present invention, by combining a balanced type DDA with a single end type DDA to carry out a feedback control so that a virtual short-circuit is established between two input terminals of each differential input stages, it is possible to obtain a differential amplifier circuit capable of reducing distortion without enlarging a linear region. By using this differential amplifier circuit, it is possible to form a non-inverting amplifier circuit and a subtracter circuit, which have high input impedance.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An amplifier circuit comprising:
   a first four-input balanced amplifier having
      a first differential terminal pair and a second differential terminal pair;
      a first output terminal and a second output terminal, output signals at the first output terminal and the second output terminal being complementary; and
   a second four input single-ended amplifier having
   a third differential terminal pair and a fourth differential terminal pair;
   a third output terminal;
   wherein the first differential terminal pair and the third differential terminal pair are connected in parallel, and the second differential terminal pair and the fourth differential terminal pair are connected in reverse parallel.

2. The amplifier circuit according to claim 1, wherein the characteristics between the first output terminal and the first differential input pair, and those between the first output terminal and the second differential input pair are matched, and wherein the characteristics between the second output terminal and the first differential input pair, and those between the second output terminal and the second differential input pair are matched.

3. The amplifier circuit according to claim 2, wherein the characteristics between the third output terminal and the third differential input pair and those between the third output terminal and the fourth differential input pair are matched.

4. The amplifier circuit according to claim 3, further comprising;
a first circuit for connecting the first output with the first differential input pair;
a second circuit connecting the second output with the second differential input pair;
wherein characteristics of said first circuit and said second circuit are matched.

5. The amplifier circuit according to claim 4, further comprising:
a third circuit for connecting the third output with the third differential input pair;
a fourth circuit for connecting the third output with the fourth differential pair;
wherein characteristics of said third circuit and said fourth circuit are matched.

6. The amplifier circuit according to claim 5, wherein said first, second, third and fourth circuits create negative feedback loops.

7. An amplifier circuit comprising:
a first four-input balanced amplifier having
a first differential terminal pair and a second differential terminal pair;
a first output terminal and a second output terminal, output signals at the first output terminal and the second output terminal being complementary; and
a second four input single-ended amplifier having
a third differential terminal pair and a fourth differential terminal pair;
a third output terminal;
wherein the first differential terminal pair and the third differential terminal pair are connected in reverse parallel, and the second differential terminal pair and the fourth differential terminal pair are connected in parallel.

8. The amplifier circuit according to claim 7, wherein the characteristics between the first output terminal and the first differential input pair, and those between the first output terminal and the second differential input pair are matched, and wherein the characteristics between the second output terminal and the first differential input pair, and those between the second output terminal and the second differential input pair are matched.

9. The amplifier circuit according to claim 8, wherein the characteristics between the third output terminal and the third differential input pair and those between the third output terminal and the fourth differential input pair are matched.

10. The amplifier circuit according to claim 9, further comprising:
a first circuit for connecting the first output with the first differential input pair;
a second circuit for connecting the second output with the second differential input pair;
wherein characteristics of said first circuit and said second circuit are matched.

11. The amplifier circuit according to claim 10, further comprising:
a third circuit for connecting the third output with the third differential input pair;
a fourth circuit for connecting the third output with the fourth differential pair;
wherein characteristics of said third circuit and said fourth circuit are matched.

12. The amplifier circuit according to claim 11, wherein said first, second, third and fourth circuits create negative feedback loops.

* * * * *